United States Patent [19]
Golobay et al.

[11] Patent Number: 5,963,422
[45] Date of Patent: Oct. 5, 1999

[54] SYSTEMS AND METHODS FOR RELEASEABLY SECURING AN ARTICLE WITHIN A COMPUTER SYSTEM

[75] Inventors: Gary L. Golobay; Robert T. Harvey, both of Wichita, Kans.

[73] Assignee: LSI Logic Corporation, Milpitas, Calif.

[21] Appl. No.: 08/885,443

[22] Filed: Jun. 30, 1997

[51] Int. Cl.⁶ .............................. H05K 5/00; G06F 1/16
[52] U.S. Cl. ...................... 361/686; 361/683; 361/726; 49/503; 312/328
[58] Field of Search ................................... 361/683–685, 361/686, 724, 726, 740; 220/324, 333; 312/222, 223.1–223.3, 328; 211/41.12; 49/381, 394, 399

[56] References Cited

U.S. PATENT DOCUMENTS

| | | | |
|---|---|---|---|
| 586,003 | 12/1996 | Schmitt et al. | 361/683 |
| 4,941,841 | 7/1990 | Darden et al. | 439/377 |
| 5,264,986 | 11/1993 | Ohgami et al. | 361/740 |
| 5,269,698 | 12/1993 | Singer | 439/157 |
| 5,316,168 | 5/1994 | Finch et al. | 220/334 X |
| 5,379,184 | 1/1995 | Barraza et al. | 361/685 |
| 5,442,513 | 8/1995 | Lo | 361/685 |
| 5,483,419 | 1/1996 | Kaczeus, Sr. et al. | 361/685 |
| 5,510,955 | 4/1996 | Taesang | 361/685 |
| 5,515,515 | 5/1996 | Kennedy et al. | 312/332.1 |
| 5,557,499 | 9/1996 | Reiter et al. | 361/685 |
| 5,574,625 | 11/1996 | Ohgami et al. | 361/684 |
| 5,588,728 | 12/1996 | Eldridge et al. | 361/685 |

Primary Examiner—Leo P. Picard
Assistant Examiner—Jayprakash N. Gandhi
Attorney, Agent, or Firm—Wayne P. Bailey; Darin Gibby

[57] ABSTRACT

The invention provides exemplary systems and methods for releasably securing a data storage device within a data storage system. In one exemplary embodiment, the invention comprises a cabinet which defines an enclosure. The data storage device is removably held within the enclosure. A cover is further provided which comprises a pivot end and a latch end. The pivot end is pivotally attached to the data storage device so that pivoting of the cover will release the data storage device at least partially from the enclosure. A cover latch is operably attached to the latch end, with the cover latch engaging the data storage device to prevent pivoting of the cover when the cover is closed.

36 Claims, 7 Drawing Sheets

SYSTEMS AND METHODS FOR RELEASEABLY SECURING AN ARTICLE WITHIN A COMPUTER SYSTEM

FIELD OF THE INVENTION

The invention relates generally to the field of data storage devices, and in particular to locking mechanisms to prevent the unauthorized withdrawal of a removable data storage device from a computer system.

BACKGROUND OF THE INVENTION

Many of today's large computer systems demand mass storage capabilities. To accommodate such requirements, a variety of mass storage schemes and devices have been proposed, including fixed disk drives, backup tape, mirrored drives, and the like. One promising type of mass storage device is a removable disk drive that may be manually inserted into and removed from a computer system. Such disk drives provide large storage capabilities while also providing convenience by allowing the disk drive to be easily removed and replaced, such as in the case of disk drive failure.

One problem faced by many data storage systems is the need to keep the stored data confidential. A variety of schemes have been proposed to protect access to confidential data. For example, many computer systems include software applications that require passwords or other special knowledge to gain access to confidential information.

Although such protection schemes may be useful with computer systems having permanently mounted storage systems, such schemes are ill suited for use with removable disk drives. For example, access to the data on a removable drive may be simply obtained by removing the disk drive and inserting it into another computer system to gain access to the confidential data.

Hence, it would be desirable to provide systems and methods for preventing or substantially hindering undesirable access to confidential information stored on a removable disk drive. Such systems and methods should also be easy and convenient to use in order to facilitate removal of the disk drive when desired.

SUMMARY OF THE INVENTION

The invention provides exemplary systems and methods for securing data storage devices to data storage systems to prevent unwanted removal of the data storage devices. In this way, increased security may be provided to the data storage system by preventing unauthorized withdrawal of the data storage devices.

In an exemplary embodiment, a locking system is provided for releasably securing an article, such as a data storage device, within a computer system, such as a data storage system. The locking system comprises a cover which may be pivotally attached to the data storage device and includes a cover cam to unseat or disconnect the data storage device from the data storage system upon pivoting of the cover. A locking mechanism is further provided to selectively prevent the cover from pivoting. Hence, by preventing the cover from pivoting, the data storage device will remain securely connected to the data storage system. In this way, unwanted removal of the data storage device from the data storage system will be prevented until the locking mechanism is operated to allow the cover to pivot.

In one exemplary aspect, the locking mechanism comprises a cover latch on the cover which is configured to engage a catch and a locking cam to release the latch. In this way, the locking cam may be operated to allow the cover latch to be released from the catch to in turn allow the cover to be pivoted. Preferably, the catch will be disposed on the data storage device. Optionally, the locking cam may be provided with a lock to prevent undesirable operation of the locking cam.

In another exemplary aspect, a locking bar is further provided having at least one slot. With this configuration, the cover latch further comprises a latch surface and a locking projection. With this arrangement, pivoting of the cover latch causes the locking projection to move within the slot when the slot is aligned with the locking projection. In turn, the latch surface moves out of engagement with the catch on the data storage device to allow the cover to be pivoted. Conversely, the locking bar will prevent pivoting of the cover latch when the slot is out of alignment with the locking projection. Preferably, operation of the locking cam will move the locking bar in a lateral direction to move the slot in and out of alignment with the locking projection.

In another exemplary aspect, the locking cam comprises two orthogonal surfaces to provide a bistable function for the cam. In this way, the slot may be stably held in alignment with the locking projection to allow the cover to pivot.

In another exemplary embodiment, the invention provides a data storage device which is adapted to be removably held within a data storage system. The data storage device comprises a canister housing a disk drive. The cover is pivotally mounted to the canister to allow the canister to be released from the data storage system when the cover is pivoted. A latching mechanism is further provided to releasably secure the cover to the canister in order to prevent release of the canister from the data storage system. In this way, the canister will remain attached to the data storage system until the latching mechanism is operated to allow the cover to be pivoted, which in turn will release the canister from the data storage system.

In one particularly preferable aspect, the latching mechanism comprises a movable locking bar having at least one slot and a locking projection which is operably attached to the cover latch. The locking projection is movable within the slot to allow the cover latch to pivot when the slot is aligned with the locking projection. In this way, the cover may remain locked until the locking bar is moved to align the slot with the locking projection on the cover latch. When the slot is out of alignment with the locking projection, the latching mechanism engages a catch to prevent the cover from pivoting. Preferably, the catch will be disposed on the canister, although other locations are possible.

Use of such a locking bar is also advantageous in that it may be used to prevent the release of a plurality of covers, thereby providing a single locking mechanism for a plurality of data storage devices which are housed within the data storage system. The slots will preferably be configured so that they will each be aligned with one of locking projections to allow each cover to be unlocked by a single movement of the locking bar.

In another exemplary aspect, the latching mechanism further comprises a latch surface which is attached to the cover. In this way, movement of the locking projection within the slot moves the latch surface out of engagement with the catch on the canister. In another exemplary aspect, a locking cam is further provided to laterally move the locking bar. In this way, the locking cam may be operated to align the slot with the locking projection. In still another aspect, the cover includes at least one camming surface to unseat or disconnect the canister from the data storage system when the latching mechanism is released and the cover is pivoted.

In still a further embodiment, the invention provides an exemplary data storage system which comprises a cabinet defining an enclosure. At least one data storage device is removably held within the enclosure. A cover is further provided which comprises a pivot end and a latch end. The pivot end is pivotally attached to the data storage device and is configured such that pivoting of the cover will release the data storage device at least partially from the enclosure. A cover latch is operably attached to the latch end and engages a catch to prevent pivoting of the cover when the cover is closed. In this way, the data storage device will remain secured within the enclosure until the cover latch is operated to allow the cover to pivot, thereby detaching the data storage device from the enclosure.

In one particular aspect, the enclosure includes a connector, and the data storage device also includes a connector. The two connectors are mateable so that when the data storage device is within the enclosure and the cover is closed, the two connectors will be mated to secure the data storage device within the enclosure.

In another aspect, a plurality of data storage devices are held within the data storage system. A locking bar is provided having a plurality of slots. With this arrangement, the latches preferably each comprise a locking projection and a latch surface which engage the catches. The locking bar is movable to move the slots into alignment with the locking projections, thereby allowing the locking projections to move within the slots and allowing the latch surfaces to disengage the catches. Preferably, the latches are pivotal relative to the covers to allow the locking projections and the latch surfaces to move by lifting the latch ends of the covers. Hence, when the slots are aligned with the locking projections, lifting of one of the latches disengages the latch surface from the catch and allows the cover to be pivoted, which in turn releases the data storage device from the enclosure.

In another exemplary aspect, a locking cam is further provided and is in engagement with the locking bar. In this way, movement of the locking cam will move the locking bar to align the slots with the locking projections. Preferably, the locking cam comprises two orthogonal surfaces to provide a bistable function. In still another aspect, a cover cam is preferably provided near the pivot end of each data storage device. In this way, the cover cam will disconnect the two connectors upon pivoting of the cover.

In still another embodiment, the invention provides an exemplary locking system for releaseably securing an article within a computer system. The locking system comprises a cover which is adapted to be pivotally attached to the article at a first axis. A latching mechanism is pivotally attached to the cover at a second axis, with the latching mechanism selectively preventing pivoting of the cover about the first axis when latched. A stop is provided to selectively prevent unlatching of the latching mechanism. More particularly, the stop selectively prevents pivoting of the latching mechanism about the second axis to in turn prevent the cover from pivoting about the first axis. In this way, the cover may not be opened until the stop is moved to allow the latching mechanism to pivot about the second axis.

The invention further provides an exemplary method for introducing a data storage device into a data storage system. According to the method, the data storage device is inserted into the data storage system. A cover on the data storage device is then closed to connect the data storage device to the data storage system. Closing of the cover further engages a cover latch on the cover with a catch to prevent opening of the cover. In this way, the data storage device will remain engaged with the data storage system until the cover is released from the data storage device. Upon disengagement of the latch, the cover may be opened to disconnect the data storage device from the data storage system. Preferably, the cover includes a cover cam so that when the cover is open, the cover cam is moved to disconnect the data storage device from the data storage system.

In another exemplary aspect, the cover latch is pivoted to move the cover latch out of engagement with the catch on the data storage device. In still another aspect, the cover latch comprises a latch surface and a locking projection. With this arrangement, the locking bar is moved to move a slot on the locking bar into alignment with the locking projection. In turn, this allows the locking projection to be moved into the slot and allows the latch surface to move out of engagement with the catch on the data storage device.

Once the data storage device has been disconnected from the data storage system, it will preferably be pulled from the data storage system and be replaced with another data storage device.

DETAILED DESCRIPTION OF THE SPECIFIC EMBODIMENTS

Figure 1:
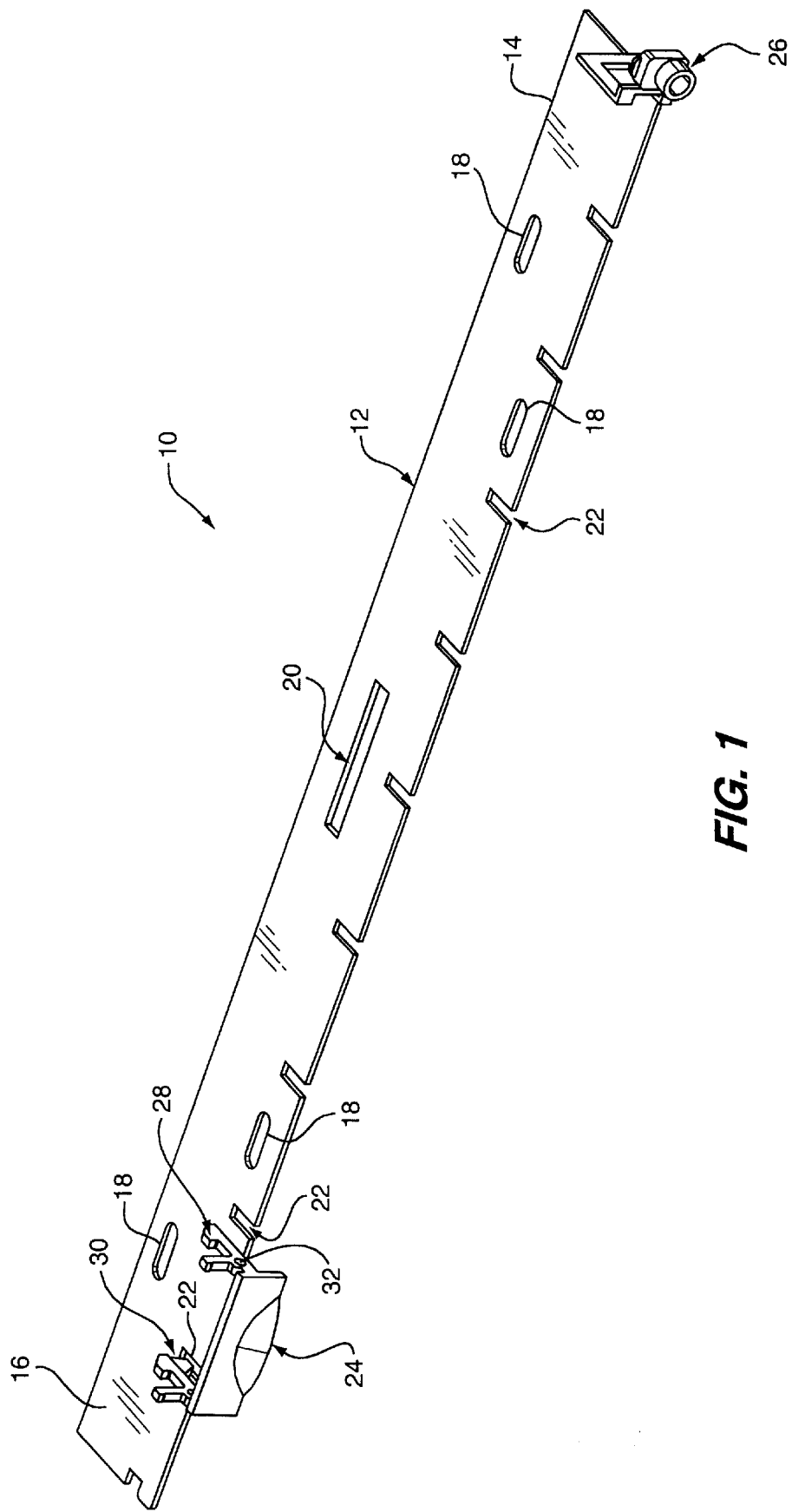
FIG. 1 is a top perspective view of an exemplary locking system according to the invention.

The invention provides exemplary systems and methods for providing securing to data storage devices which are configured to be removable from a larger data storage system. The data storage devices of the invention will preferably be configured to electrically and mechanically mate with a data storage system, e.g., a computer system, when the data storage device is inserted into the data storage system. In this way, the data storage device may be removed from the data storage system by simply pulling the data storage device to disconnect the connectors. The systems and methods of the invention provide an exemplary locking mechanism which selectively prevents disconnection of the data storage device from the data storage system. In this way, unauthorized withdrawal of the data storage device from the data storage system will be prevented unless the locking mechanism is operated to allow for the disconnection.

Although described in the context of data storage devices, it will be appreciated that the systems and methods of the invention may be used to selectively secure other computer components within a computer system including, for example, electronic boards, various peripheral devices, and the like.

In an exemplary embodiment, the data storage device comprises a disk drive that is held within a canister. Further, the canister includes a pivotable cover having at least one cam which will disconnect the data storage device from the data storage system when the cover is lifted. Conversely, when the data storage device is inserted into the data storage system and the cover is closed, the cover cam will firmly connect the data storage device to the data storage system. The invention provides a locking mechanism which selectively prevents movement of the cover relative to the canister to in turn prevent disconnection of the data storage device from the data storage system until the locking mechanism is operated to allow the cover to be lifted.

In one exemplary aspect, the locking mechanism of the invention comprises a cover latch which is pivotally attached to the cover. The cover latch includes a latch surface which engages a catch on the canister to prevent the cover from being lifted until the latch surface is disengaged from the catch. Such disengagement may be accomplished by pivoting the cover latch relative to the cover to move the latch surface away from the catch.

The locking mechanism further comprises a stop, preferably a locking bar, which will prevent pivoting of the cover latch until the locking bar is moved to place a locking projection on the cover latch in alignment with a slot or opening. In this way, when the slot or opening is aligned with the locking projection, the cover latch may be pivoted to disengage the latch surface from the catch on the canister. Such an arrangement is advantageous in that mechanisms for moving the locking bar may be provided on the data storage system which must be operated in order to allow the cover to pivot. A wide variety of devices or mechanisms may be provided to move the locking bar, including, for example, cams, levers, toggles, and the like. Optionally, a lock may be provided to prevent operation of the cam or other moving device until the lock is unlocked. In this way, authorized removal of the data storage device may be controlled by controlling access to a key, a combination, or the like, required to unlock the lock.

Referring now to FIG. 1, an exemplary embodiment of a locking system 10 will be described. Locking system 10 comprises locking bar 12 which, for convenience of discussion, may be divided into a right-hand side 14 and a left-hand side 16. Locking bar 12 is constructed of a rigid material and includes a plurality of mounting slots 18 which allow locking bar 12 to be mounted within a data storage system while allowing for lateral movement of locking bar 12. Locking bar 12 further includes an elongate slot 20 into which a spring or other biasing member can be placed to bias locking bar 12 generally in the right-hand direction as will be described in greater detail hereinafter. Locking bar 12 still further includes a plurality of latch slots 22 for receiving a cover latch 24 as will be described in greater detail hereinafter. Although shown as slots, it will be appreciated that latch slots 22 may be constructed as simple apertures or recesses within locking bar 12, so long as they are capable of receiving cover latch 24 when properly aligned as described hereinafter. Further, although shown with a plurality of latch slots 22, it will be appreciated that in some cases only one latch slot will be needed. Use of a plurality of latch slots 22 is advantageous when used in connection with a plurality of data storage devices. In particular, each slot may be used with a separate data storage device to allow for its release.

Figure 2:
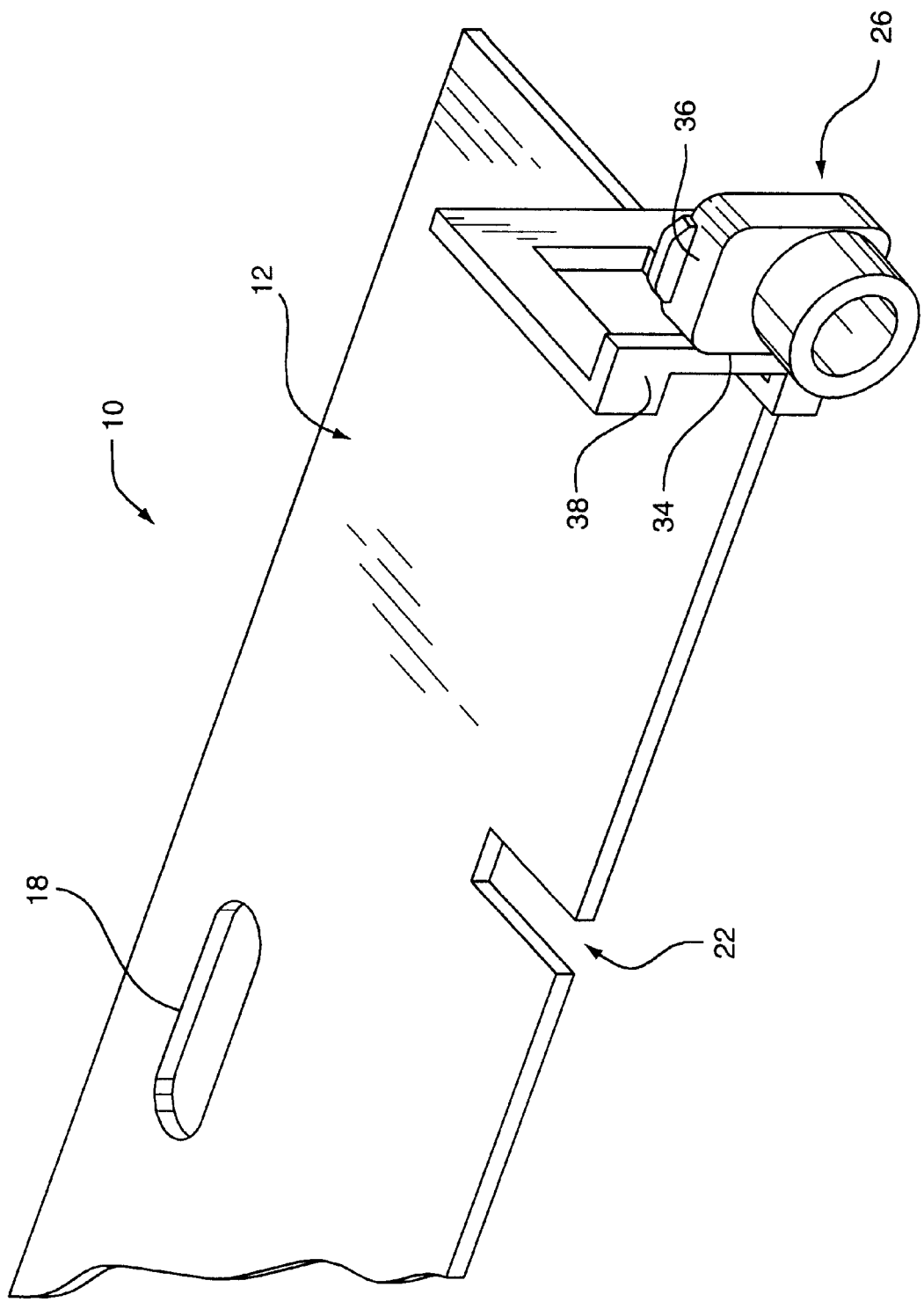
FIG. 2 is an enlarged view of a right-hand side of the locking system of FIG. 1, illustrating a locking cam which is arranged to place the locking mechanism in an unlocked position according to the invention.
Figure 3:
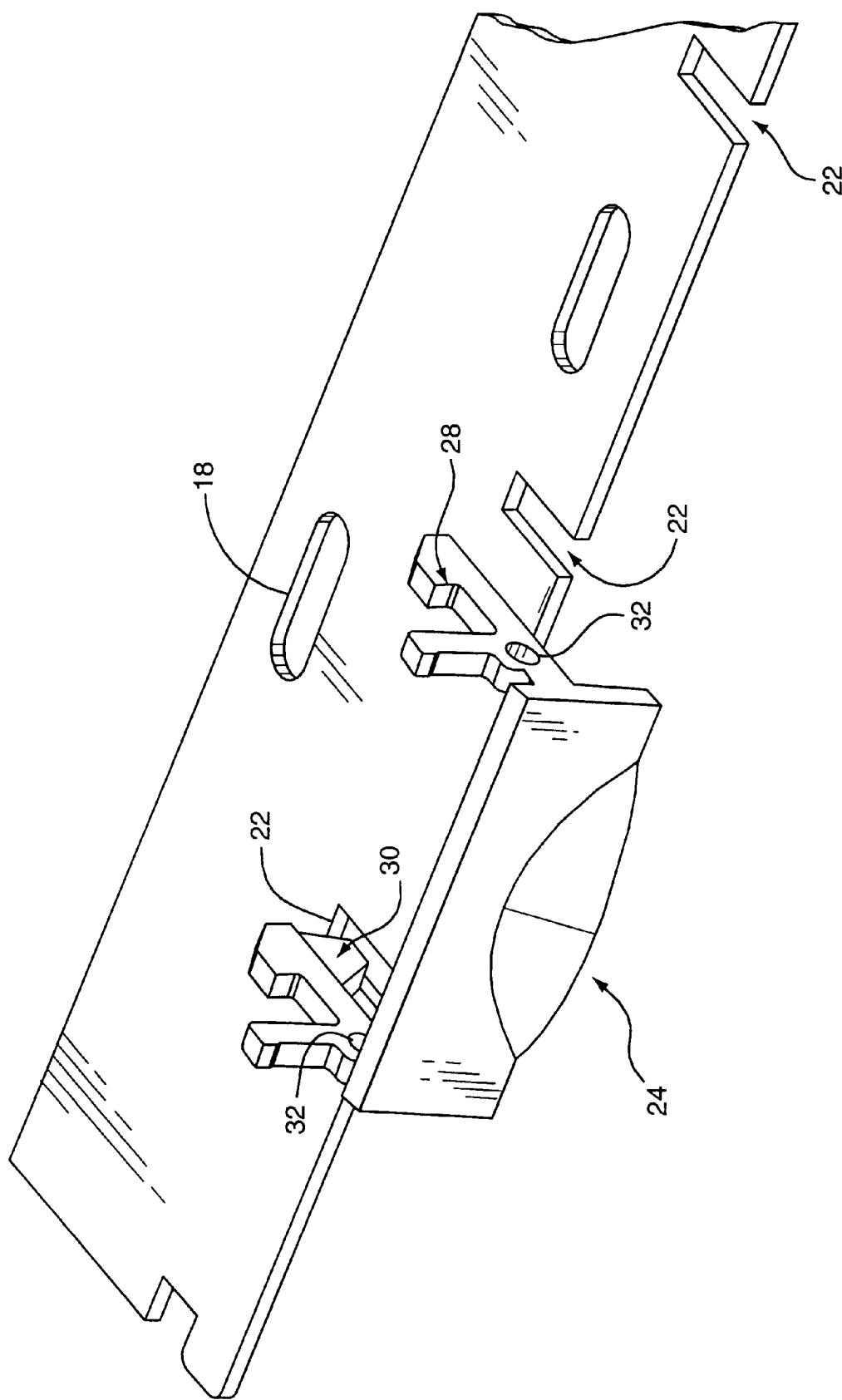
FIG. 3 is an enlarged view of a left-hand side of the latching system of FIG. 1 when in the unlocked position.

At right-hand side 14 is a locking cam 26. Locking cam 26 is operated to laterally move locking bar 12. In this way, locking cam 26 may be employed to align at least one of latch slots 22 with cover latch 24. Referring now to FIGS. 1–3, operation of locking cam 26 and cover latch 24 will be described in greater detail. As best shown in FIGS. 1 and 3, cover latch 24 comprises a latch surface 28 and a locking projection 30. Cover latch 24 further includes a pair of pivot points 32 which allow cover latch 24 to be pivotally attached to a cover of a disk drive canister as will be described in greater detail with reference to FIGS. 6 and 7.

Figure 4:
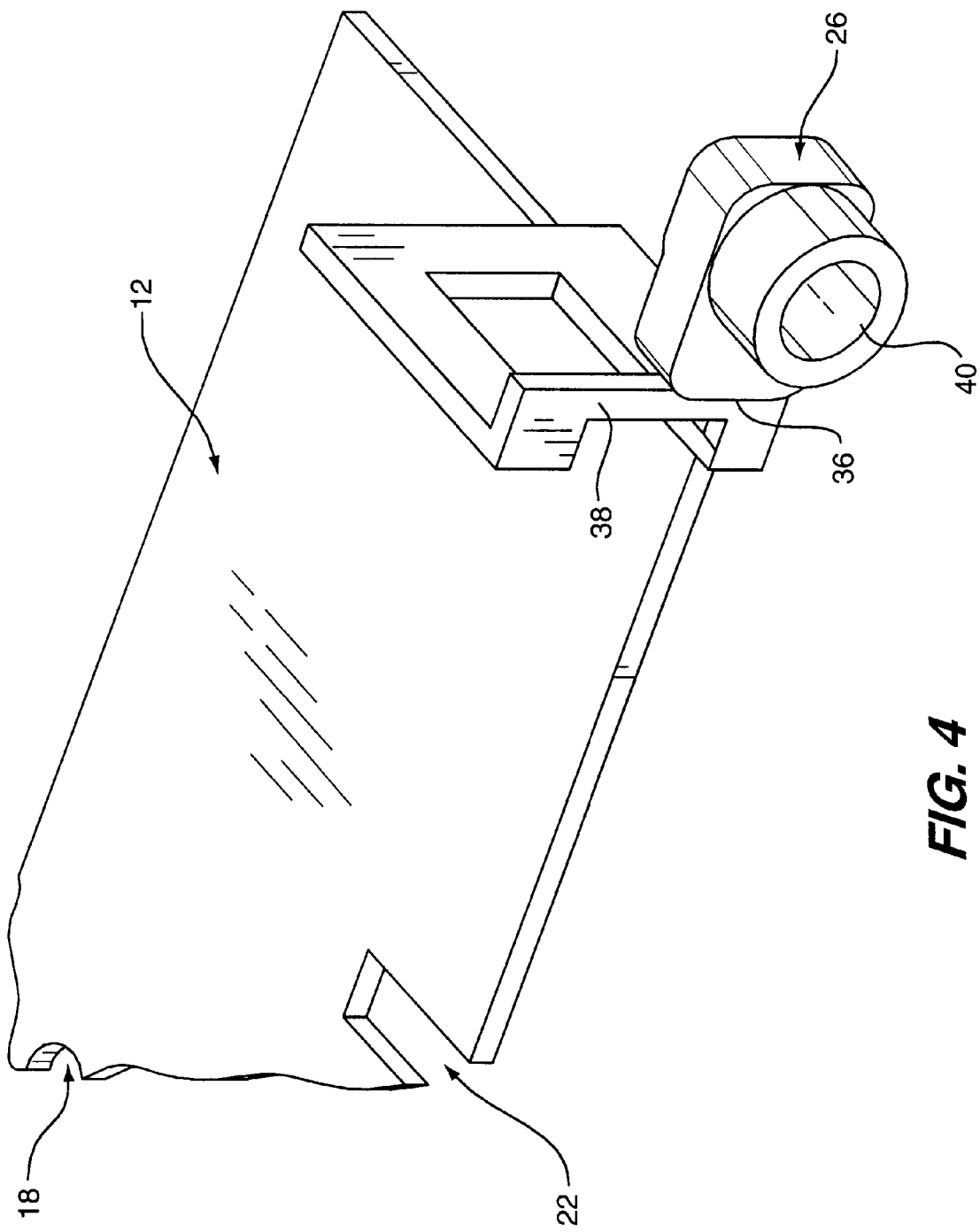
FIG. 4 illustrates the right-hand side of the locking system of FIG. 2 with the cam positioned to place the locking system in a locked position.

As best shown in FIG. 2, locking cam 26 comprises a first surface 34 and a second surface 36. Surfaces 34 and 36 are preferably orthogonal to each other to provide a bistable function for cam 26, i.e., cam 26 will be stable in either the position shown in FIG. 2 or as shown in FIG. 4. The two positions are achieved by engaging either surface 34 or surface 36 with a rail 38 of locking bar 12. As shown in FIG. 2, locking cam 26 is in an unlocked position. In this position, the biasing member (not shown) within slot 20 (see FIG. 1) biases rail 38 against first surface 34. As illustrated in FIG. 3, when locking cam 26 is in the unlocked position, latch slot 22 is aligned with locking projection 30. In this way, cover latch 24 may be pivoted about pivot points 32 since locking projection 30 may be received within slot 22. Otherwise, locking bar 12 would prevent pivoting of cover latch 24 about pivot points 32. As cover latch 24 is allowed to pivot about pivot points 32, latch surface 28 will also pivot about pivot points 32 to allow latch surface 28 to disengage from a catch (not shown) as will be described in greater detail with reference to FIG. 6. Latch surface 28 is spaced above locking bar 12 sufficiently so that it will be allowed to pivot above locking bar 12 in order to release the catch when locking projection 30 enters slot 22.

Figure 5:
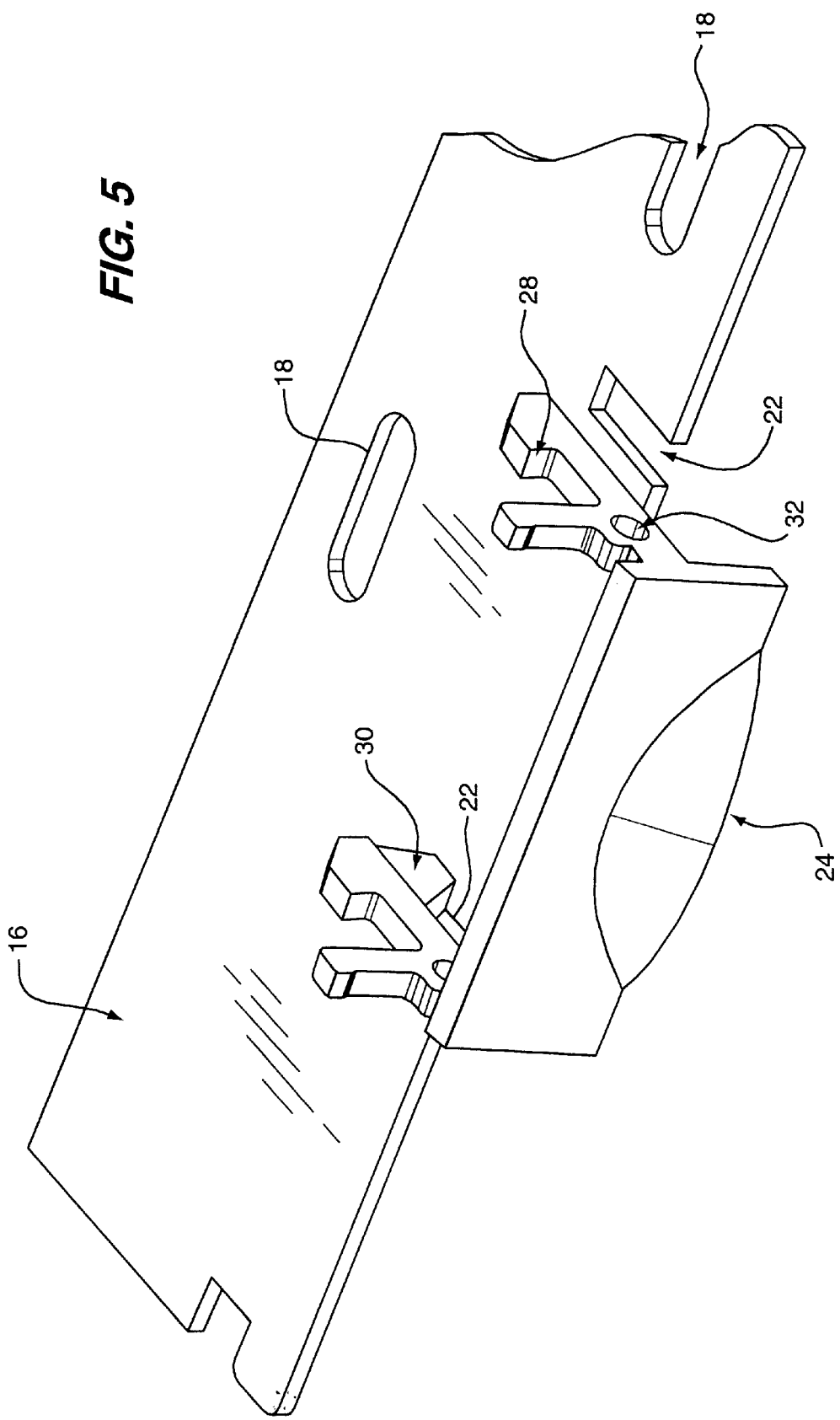
FIG. 5 illustrates the left-hand side of the locking system of FIG. 3 in a locked position.

As illustrated in FIGS. 4 and 5, locking cam 26 may be placed in the locking position by rotating locking cam 26 90° in a counterclockwise direction to place second surface 36 in engagement with rail 38. Conveniently, locking cam 26 may be rotated by placing an Allen wrench in aperture 40 and rotating locking cam 26. Optionally, a lock may be provided so that locking cam 26 cannot be rotated until unlocked.

As illustrated in FIG. 5, when locking cam 26 is in the locked position, locking bar 12 is pushed to the left to move latch slot 22 out of alignment with locking projection 30. In this way, locking bar 12 prevents rotation of cover latch 24 about pivot points 32. In turn, latch surface 28 remains stationary to prevent unlatching of cover latch 24 from a catch.

Figure 6:
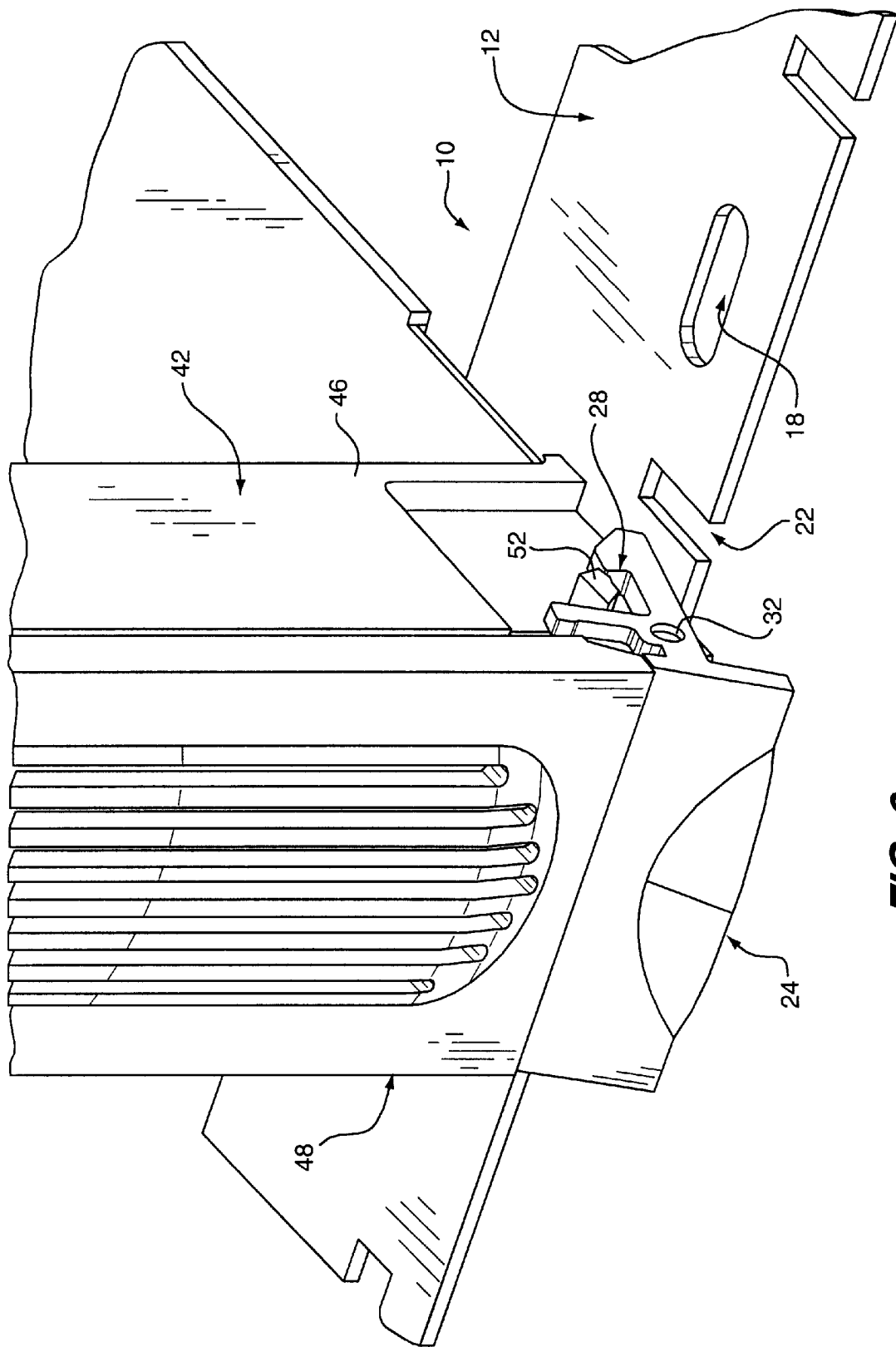
FIG. 6 illustrates the left-hand side of the locking system of FIG. 3 along with a data storage device having a pivotable cover which is being unlatched to allow for removal of the data storage device according to the invention.
Figure 7:
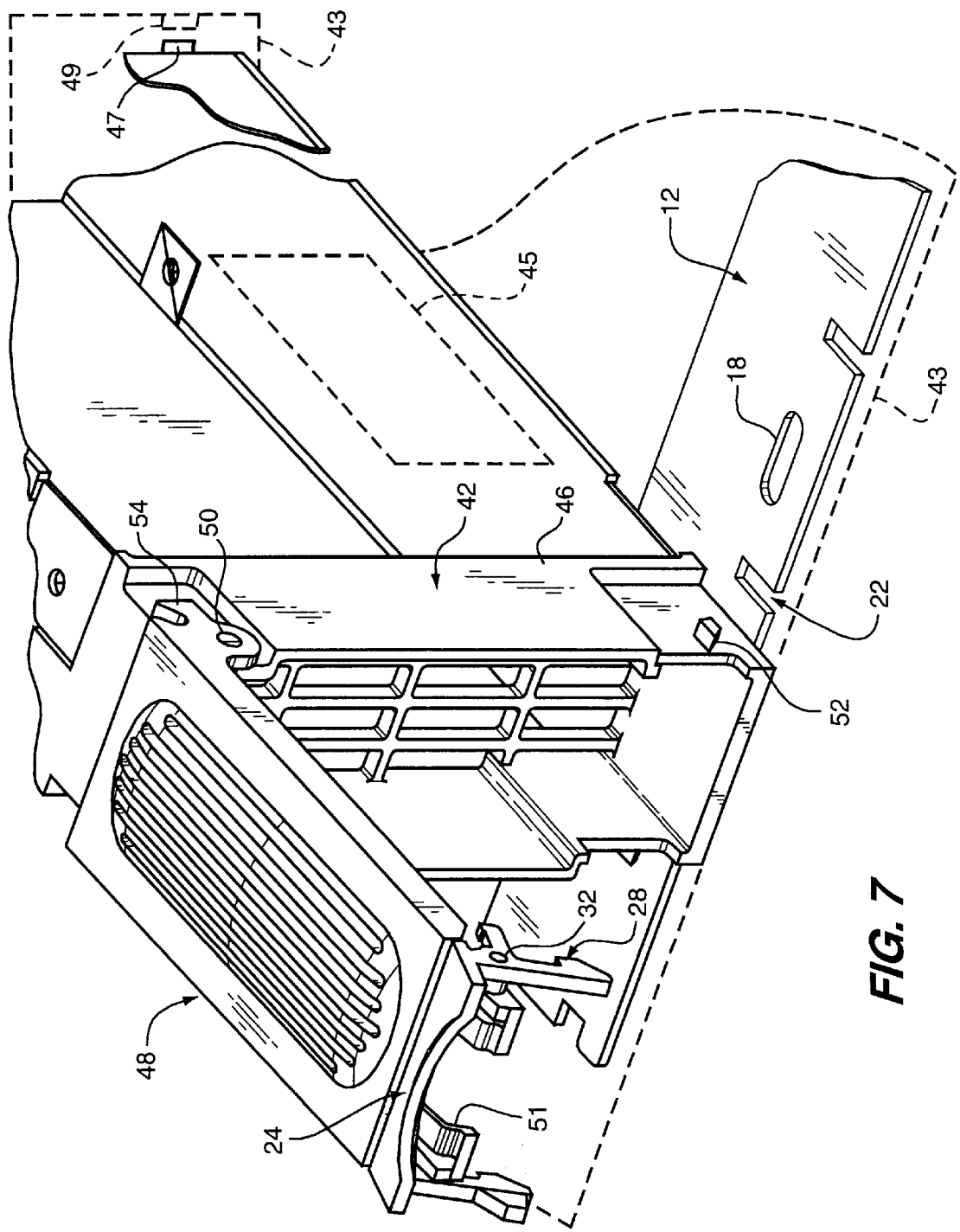
FIG. 7 illustrates the latching mechanism and data storage device of FIG. 6, with the cover being pivoted to unseat the data storage device and allow for its removal.

Referring now to FIGS. 6 and 7, locking system 10 will be shown in combination with a data storage device 42 to releasably secure data storage device 42 within a data storage system. For convenience of illustration, the data storage system is not shown in the figures, but will be configured to house data storage device 42 and locking bar 12. In FIGS. 6 and 7, locking system 10 is in the unlocked position as previously described in connection with FIGS. 2 and 3. For convenience of illustration, only one data storage device is shown. However, it all be appreciated that a plurality of such devices may be placed adjacent each other, with locking bar 12 servicing all of the data storage devices.

Data storage device 42 comprises a canister 46 into which a disk drive (not shown) is received. A cover 48 is pivotally attached to canister 46 at a pivot point 50 (see FIG. 7).

Further, cover latch 24 is pivotally attached to cover 48 at pivot points 32.

As best illustrated in FIG. 6, canister 46 includes a catch 52 which engages latch surface 28 of cover latch 24 when locking bar 12 is in the locked position. When locking bar 12 is unlocked, locking bar 12 moves to the right to align latch slot 22 with locking projection 30 as previously described in connection with FIGS. 2 and 3. (When employing a plurality of data storage devices, each latch slot will preferably be aligned with the locking projection on the associated data storage device to allow each of the data storage devices to be selectively removed). When properly aligned, cover latch 24 may be pivoted about pivot points 32 to rotate latch surface 28, thereby allowing for the release latch surface 28 from catch 52. When unlatched, cover 48 may be pivoted upward about pivot point 50.

As illustrated in FIG. 7, cover 48 includes at least one cover cam 54 which engages a surface (not shown) of a cabinet 43 on the data storage system to unseat or disconnect data storage device 42 (having a disk drive 45) from the data storage system as cover 48 is rotated approximately 90° from its closed position. Data storage device 42 includes an electrical connector 47 which is both mechanically and electrically coupled to a mateable connector 49 on the data storage system. Such a connector generally prevents withdrawal of data storage device 42 from the data storage system until cover 48 has been rotated to the position shown in FIG. 7 to allow cover cam 54 to disconnect data storage device 42 from the data storage system.

Preferably, the electrical connectors which couple data storage device 42 to the data storage system comprise standard SCSI connectors, with one connector being a male connector and the other connector being a female connector. The male connector includes a molded housing with apertures, while the female connector includes an outer frame and a plurality of pins. The pins are received into the apertures while the frame is received around the housing. In this way, data storage device 42 will be both electrically and mechanically coupled to the data storage system when cover 48 is closed to firmly mate the two connectors.

Once data storage device 42 has been disconnected from the data storage system, data storage device 42 is removed by simply grasping cover 48 and pulling canister 46 from the data storage system. Another data storage device may then be inserted to the data storage system by sliding the canister of the new data storage device into the data storage system and rotating cover 48 downward. When moved downward, cover cam 54 will engage the data storage system to firmly connect the new data storage device with the data storage system. Cover latch 24 is then pivoted by a spring 51 (see FIG. 7) to engage latch surface 28 with catch 52. Further, locking cam 26 is rotated until placed in the locked position. In the locked position, latch slot 22 is out of alignment with locking projection 30 as previously described. In this way, cover latch 24 will be prevented from pivoting about pivot points 32 to securely lock data storage device 42 to the data storage system.

The invention has now been described in detail. However, it will be appreciated that certain changes and modifications may be made. For example, catch 52 may alternatively be separate from canister 46. In such a case, it may be possible to use the catch as the only securing mechanism between the data storage device and the data storage system. In this way, the electrical connection between the data storage device and the data storage system could be configured such that the cover cam would not be needed to unseat the data storage device from the data storage system. Therefore, the scope and content of this invention are not limited by the foregoing description. Rather, the scope and content are to be defined by the following claims.

What is claimed is:

1. A locking system for releaseably securing a data storage device within a computer system, the locking system comprising:

a cover adapted to be pivotally attached to a data storage device at a first axis;

a latching mechanism pivotally attached to the cover at a second axis, the latching mechanism selectively preventing pivoting of the cover about the first axis when latched; and a stop to selectively prevent unlatching of the latching mechanism, wherein the stop selectively prevents pivoting of the latching mechanism about the second axis to prevent the cover from pivoting about the first axis;

a catch for releaseably receiving the latching mechanism;

wherein the locking mechanism comprises a cover latch on the cover which is adapted to engage the catch and a locking cam to release the latch; and wherein the stop comprises a locking bar having at least one slot therein, wherein the cover latch further comprises a latch surface and a locking projection, wherein pivoting of the cover latch about the second axis causes the locking projection to move within the slot when the slot is aligned with the locking projection and causes the latch surface to move out of engagement with the catch to allow the cover to be pivoted about the first axis, and wherein the locking bar prevents pivoting of the cover latch about the second axis when the slot is out of alignment with the locking projection.

2. A system as in claim 1, wherein operation of the locking cam moves the locking bar in a lateral direction to move the slot in and out of alignment with the locking projection.

3. A locking system for releaseably securing an article within a computer system, the locking system comprising:

a cover adapted to be pivotally attached to an article at a first axis;

a latching mechanism pivotally attached to the cover at a second axis, the latching mechanism selectively preventing pivoting of the cover about the first axis when latched; and a stop to selectively prevent unlatching of the latching mechanism, wherein the stop is movable relative to the latching mechanism to selectively prevent pivoting of the latching mechanism about the second axis to prevent the cover from pivoting about the first axis.

4. A system as in claim 3, wherein the cover includes a cover cam to unseat the article from the computer system upon pivoting of the cover.

5. A system as in claim 3, further comprising a catch for releaseably receiving the latching mechanism.

6. A system as in claim 5, wherein the locking system is adapted to secure a data storage device, and wherein the latching mechanism comprises a cover latch on the cover which is adapted to engage the catch and a locking cam to release the latch.

7. A data storage system comprising:

a cabinet defining an enclosure;

a plurality of data storage devices removably held within the enclosure;

a cover associated with each data storage device, wherein each cover comprises a pivot end and a latch end, wherein the pivot end of each cover is pivotally attached to the associated data storage device, and wherein pivoting of the cover releases the data storage device at least partially from the enclosure;

a cover latch operably attached to each latch end, wherein each cover latch engages a catch to prevent pivoting of the cover when the cover is closed; and a locking bar having a plurality of slots, wherein each cover latch comprises a latch surface which engages the data storage device and a locking projection, wherein the locking bar is movable to move the slots into alignment with the locking projections to allow the locking projections to move within the slots and to allow the latch surfaces to disengage the data storage devices.

8. A system as in claim 7, wherein the latches are pivotable relative to the covers to move the locking projections and the latch surfaces by lifting the latch ends of the covers.

9. A system as in claim 7, further comprising a locking cam in engagement with the locking bar, wherein movement of the locking cam moves the locking bar.

10. A system as in claim 9, wherein the locking cam comprises two orthogonal surfaces to provide a bistable function.

11. A data storage system, comprising:

a cabinet defining an enclosure;

a plurality of data storage devices removably held within the enclosure;

a cover associated with each data storage device, wherein each cover comprises a pivot end and a latch end, wherein the pivot end of each cover is pivotally attached to the associated data storage device, and wherein pivoting of the cover releases the data storage device at least partially from the enclosure;

a cover latch pivotally attached to each latch end such that the cover latch is pivotable relative to the cover, wherein each cover latch engages a catch to prevent pivoting of the cover when the cover is closed; and a locking mechanism which prevents substantial pivoting of the cover latch relative to the cover until the locking mechanism is operated to allow the cover latch to pivot and to disengage the catch.

12. A system as in claim 11, wherein the enclosure includes a plurality of connectors, wherein each data storage device includes a connector which is mateable with the enclosure connectors, and wherein the enclosure connectors and the data storage device connectors mate when the data storage devices are within the enclosure and the covers are closed.

13. A system as in claim 12, further comprising a cover cam near each pivot end, the cover cams disconnecting the mated connectors upon pivoting of the cover.

14. A data storage device which is adapted to be removably held within a data storage system, the device comprising:

a canister housing a disk drive;

a cover pivotally mounted to the canister, the cover being adapted to release the canister from the data storage system when pivoted; and a latching mechanism releaseably securing the cover to the canister to prevent release of the canister from the data storage system;

wherein the latching mechanism comprises a movable locking bar having at least one slot and a locking projection operably attached to the cover, wherein the locking projection is movable within the slot to release the cover when the slot is aligned with the locking projection.

15. A device as in claim 6, wherein the latching mechanism engages a catch on the canister to prevent the cover from pivoting when the slot is out of alignment with the locking projection.

16. A device in claim 15, wherein the latching mechanism further comprises a latch surface which is attached to the cover, wherein movement of the locking projection within the slot moves the latch surface out of engagement with the catch on the canister.

17. A device as in claim 6, wherein the locking bar is adapted to be slidably attached to a data storage system.

18. A device as in claim 6, further comprising a locking cam which is adapted to be operably attached to the data storage system to laterally move the locking bar.

19. A device as in claim 14, wherein the cover includes at least one camming surface to unseat the canister from the data storage system when the latching mechanism is released and the cover is pivoted.

20. A locking system for releaseably securing a data storage device within a computer system, the locking system comprising:

a cover adapted to be pivotally attached to the article, the cover including a cover cam to unseat the article from the computer system upon pivoting of the cover; and a locking mechanism to selectively prevent the cover from pivoting, wherein the locking mechanism comprises a cover latch on the cover which is adapted to engage a catch and a locking cam to release the latch; and a locking bar having at least one slot therein, wherein the cover latch further comprises a latch surface and a locking projection, wherein pivoting of the cover latch causes the locking projection to move within the slot when the slot is aligned with the locking projection and causes the latch surface to move out of engagement with the catch on the data storage device to allow the cover to be pivoted, and wherein the locking bar prevents pivoting of the cover latch when the slot is out of alignment with the locking projection.

21. A system as in claim 20, wherein operation of the locking cam moves the locking bar in a lateral direction to move the slot in and out of alignment with the locking projection.

22. A system as in claim 21, wherein the locking cam comprises two orthogonal surfaces to provide a bistable function.

23. A locking system for releaseably securing an article within a computer system, the locking system comprising:

a cover adapted to be pivotally attached to the article, the cover including a cover cam to unseat the article from the computer system upon pivoting of the cover; and a locking mechanism preventing the cover from pivoting until the locking mechanism is operated to release the cover, said losing mechanism comprising a cover latch pivotally attached to the cover which is adapted to engage a catch.

24. A system as in claim 1, wherein the locking system is adapted to secure a data storage device, and wherein the locking mechanism includes a locking cam to release the cover latch when the locking mechanism is operated.

25. A method for releasably housing an article within a housing, the method comprising:

inserting the article into the housing;

pivoting a cover on the article about a first axis to operably connect the article to the housing and to engage a cover latch on the cover with a catch to prevent opening of the cover, wherein the cover latch is pivotally attached to the cover at a second axis; and preventing pivoting of the cover latch about the second axis with a stop that is movable relative to the cover latch to prevent disengagement of the cover latch from the catch.

26. A method as in claim 25, further comprising moving the stop to allow the cover latch to pivot about the second axis to release the cover latch from the catch and pivoting the cover about the first axis to disconnect the article from the housing.

27. A method as in claim 26, wherein the cover includes a cover cam, wherein pivoting of the cover about the first axis moves the cover cam to disconnect the article from the housing.

28. A method for releasably housing an article within a housing, the method comprising:

inserting the article into the housing;

pivoting a cover on the article about a first axis to operably connect the article to the housing and to engage a cover latch on the cover with a catch to prevent opening of the cover, wherein the cover latch is pivotally attached to the cover at a second axis;

preventing pivoting of the cover latch about the second axis to prevent disengagement of the cover latch from the catch;

allowing the cover latch to pivot about the second axis to release the cover latch from the catch and pivoting the cover about the first axis to disconnect the article from the housing; and wherein the cover latch comprises a latch surface and a locking projection, and further comprising moving a locking bar to move a slot on the locking bar into alignment with the locking projection to allow the locking projection to be moved into the slot and to allow the latch surface to move out of engagement with the catch.

29. A method for introducing a data storage device into a data storage system, the method comprising:

inserting the data storage device into the data storage system;

closing a cover on the data storage device to connect the data storage device to the data storage system and to engage a cover latch on the cover with a catch to prevent opening of the cover; and preventing substantially all movement of the cover latch relative to the catch to prevent disengagement of the cover latch from the catch when the cover is pulled in a direction away from the data storage device.

30. A method as in claim 29, further comprising allowing movement of the cover latch and opening the cover to disconnect the data storage device from the data storage system.

31. A method as in claim 30, wherein the cover includes a cover cam, wherein opening of the cover moves the cover cam to disconnect the data storage device from the data storage system.

32. A method as in claim 30, further comprising pivoting the cover latch to move the cover latch out of engagement with the catch.

33. A method as in claim 30, further comprising removing the data storage device and replacing the data storage device with another data storage device.

34. A method for introducing a data storage device into a data storage system, the method comprising:

inserting the data storage device into the data storage system;

closing a cover on the data storage device to connect the data storage device to the data storage system and to engage a cover latch on the cover with a catch to prevent opening of the cover; and preventing substantially all movement of the cover latch relative to the catch to prevent disengagement of the cover latch from the catch;

pivoting the cover latch to move the cover latch out of engagement with the catch, wherein the cover latch comprises a latch surface and a locking projection, and further comprising moving a locking bar to move a slot on the locking bar into alignment with the locking projection to allow the locking projection to be moved into the slot and to allow the latch surface to move out of engagement with the catch; and opening the cover to disconnect the data storage device from the data storage system.

35. A method as in claim 34, further comprising a locking cam which is engageable with the locking bar, and moving the locking cam to move the locking bar.

36. A method as in claim 35, wherein the locking cam comprises two orthogonal surfaces, and further comprising rotating the cam about ninety degrees to hold slot of the locking bar in alignment with the locking projection.

* * * * *